United States Patent
Feng et al.

(10) Patent No.: US 9,710,173 B2
(45) Date of Patent: Jul. 18, 2017

(54) READ CACHE MEMORY WITH DRAM CLASS PROMOTION

(71) Applicant: Micron Technology, Inc., Boise, ID (US)

(72) Inventors: Eugene Feng, San Jose, CA (US); Mathew Arcoleo, Campbell, CA (US)

(73) Assignee: Micron Technology, Inc., Boise, ID (US)

(*) Notice: Subject to any disclaimer, the term of this patent is extended or adjusted under 35 U.S.C. 154(b) by 95 days.

(21) Appl. No.: 14/282,467

(22) Filed: May 20, 2014

(65) Prior Publication Data

US 2015/0339064 A1 Nov. 26, 2015

(51) Int. Cl.
| | |
|---|---|
| G06F 3/06 | (2006.01) |
| G06F 12/08 | (2016.01) |
| G11C 29/44 | (2006.01) |
| G06F 12/10 | (2016.01) |
| G11C 7/10 | (2006.01) |
| G06F 12/0806 | (2016.01) |
| G06F 12/1081 | (2016.01) |
| G11C 29/00 | (2006.01) |
| G06F 13/28 | (2006.01) |
| G06F 12/0875 | (2016.01) |
| G06F 12/0888 | (2016.01) |
| G11C 29/04 | (2006.01) |

(52) U.S. Cl.
CPC .......... *G06F 3/0616* (2013.01); *G06F 3/0608* (2013.01); *G06F 3/0655* (2013.01); *G06F 3/0685* (2013.01); *G06F 3/0688* (2013.01); *G06F 12/0806* (2013.01); *G06F 12/0875* (2013.01); *G06F 12/0888* (2013.01); *G06F 12/1081* (2013.01); *G06F 13/28* (2013.01); *G11C 7/1072* (2013.01); *G11C 29/44* (2013.01); *G11C 29/765* (2013.01); *G06F 2212/2532* (2013.01); *G06F 2212/621* (2013.01); *G11C 2029/0409* (2013.01); *G11C 2207/2245* (2013.01); *Y02B 60/1225* (2013.01); *Y02B 60/1228* (2013.01)

(58) Field of Classification Search
CPC ......... G06F 2212/72; G06F 2212/7208; G06F 2212/7211
See application file for complete search history.

(56) References Cited

U.S. PATENT DOCUMENTS

| | | |
|---|---|---|
| 8,255,630 B1 | 8/2012 | Bali et al. |
| 8,296,496 B2 | 10/2012 | Mogul et al. |

(Continued)

FOREIGN PATENT DOCUMENTS

TW 200622634 A 7/2006

OTHER PUBLICATIONS

International Search Report and Written Opinion from related international application No. PCT/US2015/031370 dated Aug. 17, 2015, 16 pp.

(Continued)

*Primary Examiner* — Ann J Lo
*Assistant Examiner* — Michelle Taeuber
(74) *Attorney, Agent, or Firm* — Brooks, Cameron & Huebsch, PLLC

(57) ABSTRACT

The present disclosure includes methods and apparatuses for read cache memory. One apparatus includes a read cache memory apparatus comprising a first DRAM array, a first and a second NAND array, and a controller configured to manage movement of data between the DRAM array and the first NAND array, and between the first NAND array and the second NAND array.

12 Claims, 2 Drawing Sheets

(56) References Cited

U.S. PATENT DOCUMENTS

| | | | |
|---|---|---|---|
| 8,612,676 B2* | 12/2013 | Dahlen | G06F 12/0893 |
| | | | 711/113 |
| 2012/0198129 A1 | 8/2012 | Van Aken et al. | |
| 2012/0246393 A1* | 9/2012 | Hashimoto | G06F 12/0246 |
| | | | 711/103 |
| 2012/0284587 A1* | 11/2012 | Yu | G06F 3/0608 |
| | | | 714/773 |
| 2012/0311245 A1 | 12/2012 | Yano et al. | |
| 2013/0111134 A1* | 5/2013 | Benhase | G06F 12/0811 |
| | | | 711/122 |
| 2013/0119542 A1 | 5/2013 | Oh | |
| 2013/0134607 A1 | 5/2013 | Gillingham | |
| 2014/0101378 A1* | 4/2014 | Olbrich | G06F 13/1657 |
| | | | 711/103 |
| 2014/0122782 A1* | 5/2014 | Yano | G06F 12/0246 |
| | | | 711/103 |
| 2015/0052393 A1* | 2/2015 | Palmer | G06F 12/0246 |
| | | | 714/15 |

OTHER PUBLICATIONS

Badam, "Bridging the Memory-storage Gap," Dissertation presented at Princeton University, Nov. 2012, 124 pp. (uploaded in two parts).

Office Action from related Taiwanese patent application No. 104116100, dated Jan. 29, 2016, 21 pp.

* cited by examiner

READ CACHE MEMORY WITH DRAM CLASS PROMOTION

TECHNICAL FIELD

The present disclosure relates generally to semiconductor memory apparatus and methods, and more particularly, to read cache memory.

BACKGROUND

Memory devices are typically provided as internal, semiconductor, integrated circuits in computers or other electronic devices. There are many different types of memory including volatile and non-volatile memory. Volatile memory can require power to maintain its data (e.g., information) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, resistance variable memory, such as phase change random access memory (PCRAM) and resistive random access memory (RRAM), and magnetic random access memory (MRAM), such as spin torque transfer random access memory (STTRAM), among others.

Memory devices can be combined to form a solid state drive (SSD). A solid state drive can include non-volatile memory such as NAND flash memory and/or NOR flash memory, and/or can include volatile memory such as DRAM, among various other types of non-volatile and volatile memory. In some instances, caching can be utilized in SSDs.

DETAILED DESCRIPTION

Figure 1:
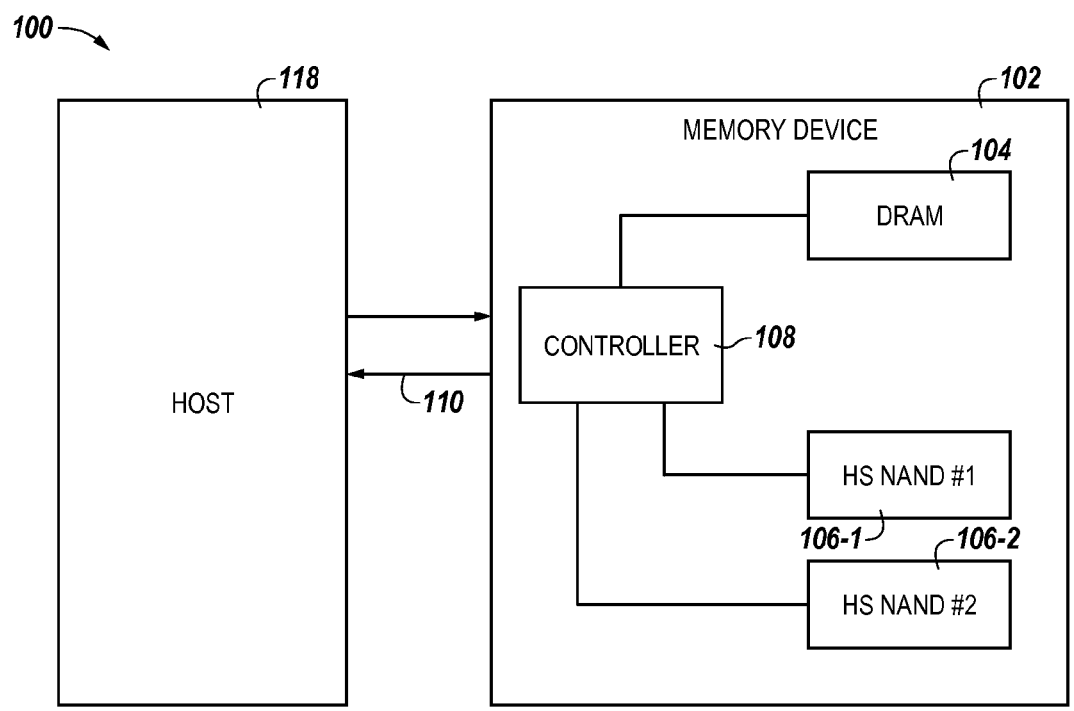
FIG. 1 is a block diagram of a system including read cache memory in accordance with a number of embodiments of the present disclosure.

The present disclosure includes methods and apparatuses for read cache memory. One apparatus includes a read cache memory apparatus comprising a first DRAM array, a first and a second NAND array, and a controller configured to manage movement of data between the DRAM array and the first NAND array, and between the first NAND array and the second NAND array.

Embodiments of the present disclosure can include schemes to cache DRAM data into NAND and provide a tier or layer of memory devices sitting between a host and a storage memory device (e.g., NAND, SSD, etc.) for read cache. In some embodiments, this can give an impression of more available memory. Alternatively or additionally, embodiments of the present disclosure can provide for this tier of memory to include a higher density than typical DRAM devices, while maintaining a smaller footprint than typical DRAM devices. Embodiments of the present disclosure can also provide for lower energy use by read cache as compared to other approaches, for example.

Embodiments of the present disclosure can provide for a lower cost structure than double data rate (DDR) DRAM or hybrid memory cube (HMC) at a same capacity. In addition, embodiments of the present disclosure can provide shorter read latency than a typical SSD or NAND device that are accessed through input/output (I/O) space, such as on a PCI Express (PCIe) or serial attached small computer system interface (SAS). Similarly, embodiments of the present disclosure can provide for shorter write latency than typical NAND flash, both on a direct main memory space or an I/O space. Improved endurance (e.g., cycles) due to the use of NAND flash internally to satisfy cloud storage caching needs when compared to a non-managed "raw" NAND flash solutions can be provided for in embodiments of the present disclosure, as well.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense. Further, as used herein, "a number of" something can refer to one or more of such things.

FIG. 1 is a block diagram of a system 100 including read cache memory (RCM) in accordance with a number of embodiments of the present disclosure. In embodiments of the present disclosure, data can be cached for read applications (e.g., cloud storage applications). For instance, this can be performed without executing code. An example can include the storage of media content (e.g., movies, video games, etc.) to be distributed (e.g., streamed out). Searching and retrieving this storage may be time consuming on typical caching devices, but embodiments of the present disclosure can reduce this time (e.g., using the tier of memory devices) by putting it closer to a processor and reducing the amount of time needed to retrieve from memory (e.g., NAND). In some examples of the present disclosure, system 100 can include a cloud storage application with an RCM device.

System 100 includes an apparatus in the form of a memory device 102 (e.g., an RCM device). Device 102 can include a controller 108 (e.g., ASIC), array 104 (e.g., a DRAM array), and arrays 106-1 and 106-2 (e.g., NAND arrays). As used herein, an RCM device 102, arrays 104, 106-1, and 106-2, controller 108, and/or circuitry within arrays 106-1 and 106-2 might also be separately considered an "apparatus."

In some embodiments, arrays 106-1 and 106-2 can include high speed NAND arrays. Arrays 106-1 and 106-2 can include control circuitry, in some examples. Controller 108 can include direct memory access (DMA) in some examples to fast-move contents between arrays 104, 106-1, and 106-2 within RCM device 102. In a number of embodiments, direct die-to-die bonding may be used to link together controller 108, array 104, and arrays 106-1 and 106-2, as will be discussed further herein.

Device 102 can be in communication with a host device 118 via interface 110 (e.g., a HMC-like interface, programmed input/output (PIO) interface, external bus interface (EIB), or a dedicated FPGA interface, among others). As a result, system 100 can include a similar capacity/footprint of HMC or multi-die DRAM packages (e.g., dual-die packaging (DDP), quad die packaging (QDP), etc.). This can result, for instance, in reduced cost and power while maintaining a same or similar capacity/footprint. Such an example may also increase storage access over other approaches (e.g., I/O storage access). Host device 118 can include, for instance, a field programmable gate array (FPGA) that can be in communication with an integrated circuit (IC) (e.g., southbridge/ SSD host IC), which can also be in communication with SSD/hard disk drive. IC can be in communication with a general purpose input/output interface (e.g., I/O/local I/O) via a local area network (LAN), for instance, and can also be in communication with a central processing unit (CPU) and/or a DRAM controller via the LAN or other communication type. In a number of examples, controller can report actions of RCM 102 to host device 118 via interface 110. In a number of embodiments, though not illustrated in FIG. 1, host 118 can communicate directly with controller 108 via interface 110, rather than with memory device 102.

System 100 can include components used to cache data (e.g., DRAM data) into array 106 (e.g., NAND device). For instance, only the data meeting particular thresholds (e.g., criteria) is transferred to arrays 106-1 and 106-2 to avoid frequent erase cycles (e.g., NAND erase cycles). Read cache in arrays 106-1 and 106-2 can be improved in such an example by utilizing proprietary internal features (e.g., suspends, trims, etc.), for instance. System 100 can result in increased speed of memory access and DMA to move between arrays 104, 106-1, and 106-2 internally, for example, by using wire bond technology to reduce back end packaging costs.

For example, in a number of embodiments and as will be discussed further herein, page promotion and device "ping-pong" schemes can be used to move data from (e.g., within RCM device 102) array 104 (e.g., DRAM cache) of the RCM device to array 106-1 (e.g., NAND cache) of the RCM device and between arrays 106-1 and 106-2 to reduce NAND erase cycles and increase the RCM device 102 life expectancy. Additionally, as will be discussed further herein, a dynamic bad-page marking scheme can be used to mark bad NAND pages (e.g., not entire blocks) on-the-fly when internal NAND arrays 106-1 and 106-2 begin to wear out. In response, RCM device 102 can be replaced, while avoiding abrupt failure of RCM device 102. Rather, RCM device 102 may gradually lose its NAND capacity, as an endurance limit of a NAND array is approached. For instance, when latency of system 100 is increased due to cache size reduction (e.g., at a preset threshold), RCM may be replaced.

Figure 2:
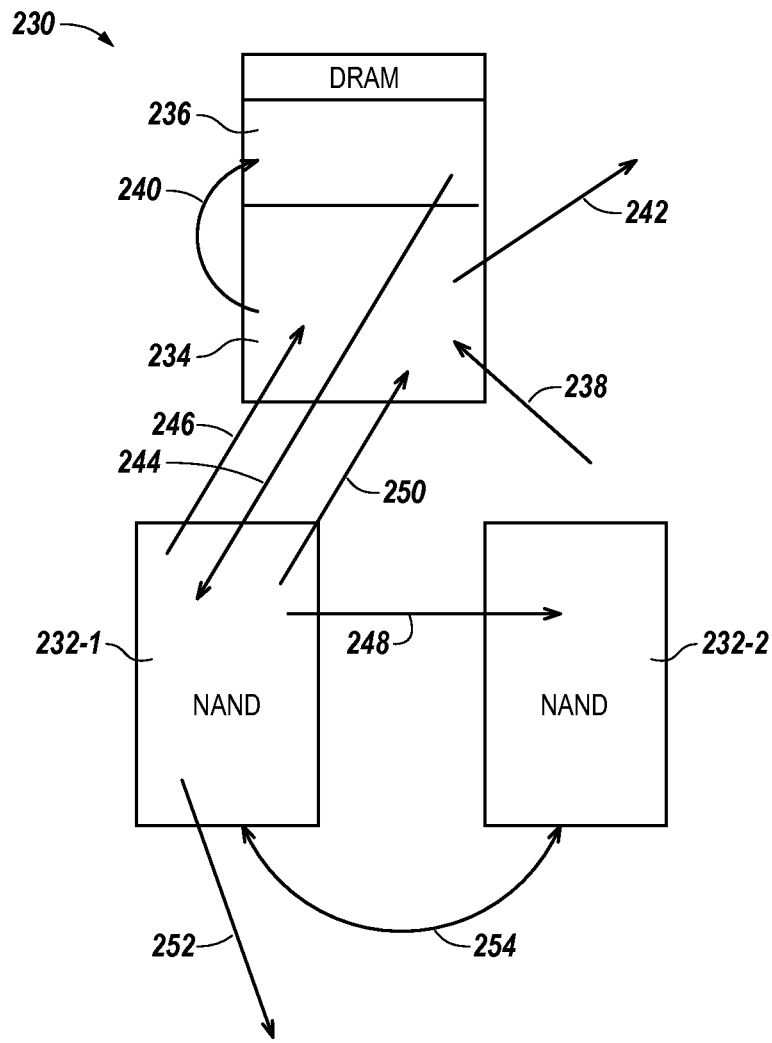
FIG. 2 illustrates an example diagram of data flow within a read cache memory in accordance with a number of embodiments of the present disclosure.

FIG. 2 illustrates an example diagram 230 of data flow within a read cache memory (e.g., RCM device 102 as illustrated in FIG. 1) in accordance with a number of embodiments of the present disclosure. Diagram 230 includes DRAM device 234, NAND device 232-1, and NAND device 232-2. While the example illustrated in FIG. 2 includes NAND and DRAM, different types and numbers of memory devices may be used. The example data flow can overcome NAND deficiencies (e.g., when used as read cache), such as, for example, limited erase cycles (e.g., cannot be erased at byte or page level); page programming challenges (e.g., a page can only be programmed once after erase); potentially lower memory utilization; no read/write concurrency in same logical unit number (LUN)/plane; potentially long latency for data replacement; sequential byte level read, page level write, and block level erase; and asymmetrical read/write timing and power, among others.

In a number of embodiments, the entire DRAM device 234 (e.g., stack of two 8 Gb DRAM dice to reach a total of 2 GB) memory space can be divided up to match the number of page size partitions (e.g., 16 KB page size when using 128 Gb NAND for total of 16 GB of RCM capacity or 256 Gb NAND for total of 32 GB of NAND RCM capacity) in the accompanying NAND space. In each RCM device (e.g., within diagram 230), two identical dice of NAND devices (e.g., devices 232-1 and 232-2) can be used to support a ping-pong scheme, as will be discussed further herein.

At 238, cached data can be written into DRAM device 234. For instance, data can be requested (e.g., by a user), and this data can be written into DRAM device 234. In such an example, a controller can monitor data coming into DRAM device 234 and rank the data based on a number of characteristics (e.g., factors), including, for instance, how often the data is accessed, how stable the data is, how large the data is, and how often the data is requested, among others.

At 240, data within DRAM device 234 can be moved (e.g., promoted) to "qualified zone" 236 when a particular threshold is met. In a number of examples, moving data can include classifying the data. For example, the data may not be physically moved to zone 236, but rather classified into a class (e.g., class/zone 236). For instance, if data within DRAM device 234 is accessed and/or requested a threshold number of times it can be moved (e.g., classified) to zone 236. In some examples, data within DRAM device 234 can be moved (e.g., classified) to zone 236 if the data meets a stability threshold (e.g., stable enough to later be promoted to NAND). For instance, the data is organized logically (e.g., by a controller).

In some embodiments, data can be packed into zone 236; for instance, the data can be packed into 16 KB packets to match NAND page sizes. Such packets can provide for increased NAND efficiency. Data within zone 236 can be promoted at 244 to NAND device 232-1 when device 234 reaches a threshold capacity (e.g., DRAM device 234 or zone 236 is near full). Doing so can make room for DRAM device 234 to receive more data and/or promote more data from within DRAM device 234 to zone 236. Data moved from DRAM device 234 to NAND device 232-1 can be organized to maximize the amount of data that can be moved to NAND device 232-1 (e.g., organized into entire pages favored by NAND).

Data not meeting the threshold requirements can be evicted at 242 to free up space on DRAM device 234. Evicting can include, for instance, dropping or overwriting data that does not meet a threshold to be promoted to zone 236 or NAND device 232-1.

In a number of embodiments, when DRAM cache (e.g., at DRAM device 234) space approaches full (e.g., only a preset number of or fewer page partitions left), the most frequently visited page partitions among qualified page partitions which have passed a preset threshold value of frequency percentage or frequency over a specific amount of time (e.g., top 30 percent of the most frequently visited data in the DRAM device 234 or visited at least 500 times within a given time period) get promoted (e.g., moved) to a primary device (e.g., primary NAND device 232-1) and leave the space of those data page partitions empty (e.g., dirty) and thus available to be used when new read cache data needs to be stored on DRAM device 234 of the RCM.

When new data needs to be cached, the least frequently visited data page partitions can be evicted from DRAM device 234 (e.g., at 242). When more qualified data fills up DRAM device 234, that data can be moved to NAND device 232-1, which may eventually fill up. As a result, in some embodiments, only the most frequently read/visited data and/or the most stable (e.g., most stationary) data will be in NAND device 232-1. The less frequently read/visited cached data will remain on DRAM device 234, with the least visited data being replaced with new cached data frequently. This may reduce a need to replace (e.g., erase) data on NAND device 232-1 of the RCM device.

Bad pages can be marked within NAND device 232-1 dynamically. As used herein, dynamically can include variable and/or constantly changing in response to a particular influence (e.g., the controller determines the page is bad). In such instances, a controller (not pictured in FIG. 2) manages what remains in NAND device 232-1. This bad page marking can reduce false marking and allow for repair of bad pages within an RCM device and NAND and DRAM devices therein. In such examples, rather than marking entire blocks of bad data, bad pages are marked, which can increase efficiency of NAND device 232-1. In some examples, the controller may perform marking and repairing of the bad pages.

For instance, when a device (e.g., NAND devices 232-1, 232-2) starts to wear out after a threshold number of erase cycles (e.g., endurance spec), data on some pages cannot be read-verified after written to the devices, thus becoming bad pages. Instead of marking the entire block permanently as bad (e.g., kept in non-volatile tables), only those specific pages that have cyclic redundancy check (CRC) error or failed read-verify after written bad pages on that particular device are marked.

The bad pages can be tracked by the controller in the RCM in RAM (e.g., memory on the controller), and when the NAND device becomes empty (e.g., at the time of switching primary and secondary positions, which will be discussed further herein), a bad page table for the empty NAND device can be erased and rebuilt over again. This is because disturbs in adjacent pages can sometimes cause CRC errors or read verification errors. When the block is erased, those pages can be good again.

In addition, before NAND cells completely fail, there may be a period of time that cell is stuck in one state, but after another erase cycle, repaired itself. Therefore, marking the NAND cell as bad may not be an accurate assessment.

At 248, the pages meeting threshold requirements can be promoted from NAND device 232-1 (e.g., primary device position) to NAND device 232-2 (e.g., secondary device position). For example, the pages can be promoted when NAND device 232-1 reaches a threshold capacity (e.g., near full). In some examples, data usage within NAND devices 232-1 and 232-2 can be monitored (e.g., tracked) by the controller. Pages not meeting threshold requirements can demoted (e.g., removed) from NAND device 232-1 at 246 and sent to DRAM device 234 within an "unqualified" zone. This can prevent over-promotion of data to NAND devices, for example, which can prevent and/or reduce NAND wear out.

When NAND device 232-2 reaches a threshold capacity (e.g., near full), remaining pages in NAND device 232-1 can be demoted to DRAM device 234 at 250 within the unqualified zone. In some examples, the remaining pages in NAND device 232-1 can be discarded (e.g., dropped, evicted, overwritten, etc.) at 252. In response, blocks that contained data in NAND device 232-1 can be erased.

In a number of embodiments NAND devices 232-1 and 232-2 (e.g., NAND die) can be used at any given time as one primary device and one secondary device. For instance, when the primary NAND device 232-1 becomes full (e.g., same and/or similar conditions as to indicate DRAM device 234 is full), the top most read/visited data pages in the primary NAND device 232-1 get promoted to the secondary NAND device 232-2 (e.g., at 248), and the least visited data pages get demoted (e.g., moved, kicked-back, etc.) to DRAM device 234. These least visited data pages can be treated as new cache data for DRAM device 234. In a number of embodiments, both the promoted and demoted data pages can be marked as dirty pages on the primary NAND device 232-1. When all pages of a given block on primary NAND device 232-1 are dirty, the block can be erased.

When the secondary NAND device 232-2 becomes full, the remaining good cached data can be demoted back to DRAM device 234, and the rest of the blocks of the primary NAND device 232-1 can be erased. After all the blocks on the primary NAND device 232-1 are erased, the position of NAND devices 232-1 and 232-2 exchange. The old, but now empty primary NAND device 232-1 becomes the new secondary NAND device, and the old, but now full secondary NAND device 232-2 becomes the new primary NAND device. This process can be repeated over and over. The data in an internal device (e.g., NAND device) is maintained as the most stationary/stably cached data, resulting in a reduced need to erase those data in the internal device, extending the endurance (e.g., life) of the internal device and reducing degradation over other approaches.

In a number of examples, the promotion and demotion actions within the read cache memory (e.g., host reporting and responding) can be managed and tracked by a controller (e.g., controller 108 as illustrated in FIG. 1). In addition to on-chip memory (e.g., within a controller), a portion of DRAM device 234 (e.g., a portion of DRAM array 104 as illustrated in FIG. 1), may be reserved for the controller to use to store control information, such as pointers, tables, statistics, counters, etc. This information may enable the controller to manage and track the movement of data to and from NAND devices 232-1 and 232-2 from DRAM device 234 and between NAND devices 232-1 and 232-2, as well as reporting this information back to a host device (e.g., host device 118 as illustrated in FIG. 1). The remainder of DRAM device 234 may be used for caching data, for example.

Figure 3:
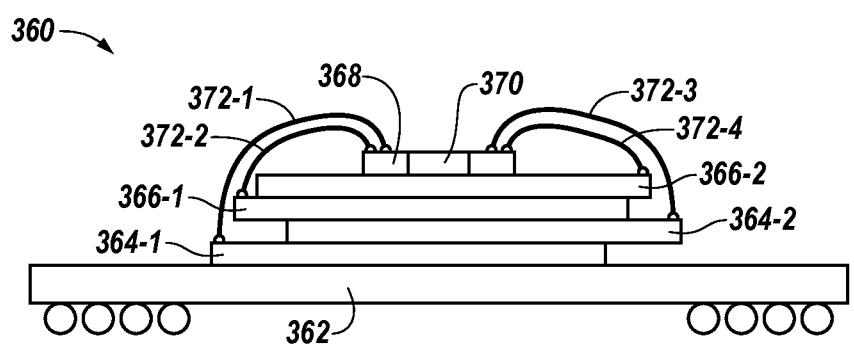
FIG. 3 illustrates an example device for read cache memory in accordance with a number of embodiments of the present disclosure.

FIG. 3 illustrates an example device 360 (e.g., system) for read cache memory in accordance with a number of embodiments of the present disclosure. Example device 360 can include a 5-known good die (KGD) stack including NAND arrays 366-1 and 366-2, DRAM arrays 364-1 and 364-2, and a controller 370 (e.g., an ASIC die). Device 360 is not limited to a 5-KGD stack or NAND and DRAM memory, however. For instance, device 360 may include 3, 4, or more NAND devices in a number of examples.

In order to gain access to all of the bond pads of the NAND and DRAM, a redistribution layer can be used. This redistribution layer can relocate the bonding pad of the RCM device. After redistributing the pads of both DRAM and NAND arrays to line up on only one of the shorter or the longer side of the array, the DRAM arrays and NAND arrays are stacked up in an off-set way, so that arrays are directly stacked on top of each other while the most bottom array (e.g., DRAM array 364-1) will expose its single row of pads on one side (e.g., left side) while the rest of the array area are overlay covered by the array on top of it (e.g., DRAM array 364-2).

The next to the bottom (e.g., second bottom) array (e.g., DRAM array 364-2) will then be 180 degrees turned and its single row of pads on the opposite side (e.g., right side) exposed while the rest of the array area are overlay covered by the array on top of it (e.g., NAND array 366-1). The bottom two arrays (e.g., DRAM arrays 364-1 and 364-2) are positioned such that the third array (e.g., NAND array 366-1) will line its single row pad parallel to the first (e.g., most bottom) array (e.g., DRAM array 364-1) (e.g., left side), but not block the first array (e.g., DRAM array 364-1) for bonding wires 372-1, . . . , 372-4 and the fourth array (e.g., NAND array 366-2) will line up its pad parallel to the second array (e.g., DRAM array 364-2), but not block the second array's (e.g., DRAM array 364-2) pad for bonding wires 372-1, . . . , 372-4. The controller 370 can sit on the very top of the stack as the fifth array (e.g., die) with pad pitches expanded by fan-out (flex) wafer level packaging (WLP) pads 368. Controller 370 can directly die-to-die bond its x-direction side (e.g., left and right) pads point-to-point with each pad on the offset stacked DRAM and NAND arrays below it. The pads on the y-direction sides of the controller 370 can be bonded to the lead frame of the package for external signals (e.g., ball grid array (BGA) package balls) access (not illustrated in FIG. 3).

In an example embodiment, as illustrated in FIG. 3, DRAM array 364-1 can be formed on a first dice coupled to substrate 362 in a staggered manner (e.g., offset, skewed). DRAM array 364-2 can be formed on a second dice coupled to the first dice in a staggered manner. NAND array 366-1 can be formed on a third dice coupled to the second dice in a staggered manner, and NAND array 366-2 can be formed a fourth dice coupled to the third dice in a staggered manner. The first, second, third, and fourth die can be coupled to the controller, for instance, via direct die-to-die bonding. In some examples, controller 370 can be coupled to the fourth dice in, can include fan-out flex pads 368, and can be in communication with dies 364-1, 364-2, 366-1, and 366-2 via die-to-die bonding wires 372-1, . . . , 372-4.

The present disclosure includes methods and apparatuses for read cache memory. One apparatus includes a read cache memory apparatus comprising a first DRAM array, a first and a second NAND array, and a controller configured to manage movement of data between the DRAM array and the first NAND array, and between the first NAND array and the second NAND array.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items.

As used herein, the term "and/or" includes any and all combinations of a number of the associated listed items. As used herein the term "or," unless otherwise noted, means logically inclusive or. That is, "A or B" can include (only A), (only B), or (both A and B). In other words, "A or B" can mean "A and/or B" or "a number of A and B."

It will be understood that, although the terms first, second, third, etc. may be used herein to describe various elements, these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a read cache memory device, comprising:
      a dynamic random-access memory (DRAM) array, comprising a first class and a second class; and
      a first NAND array and a second NAND array; and
   a controller configured to:
      dynamically mark bad pages within the first NAND array;
      simultaneous to the dynamic marking, manage movement of data between the first class and the second class, between the DRAM array and the first NAND array, and between the first NAND array the second NAND array,
         wherein data moved from the DRAM array to the first NAND array comprises a preset number of most-frequently visited page partitions among the second DRAM class that have passed a preset threshold value of frequency and wherein the controller is further configured to cache data from the DRAM array to the first NAND array based on a characteristic of the data;
         wherein the data characteristic includes at least one of a number of times the data is requested and a stability of the data;
         wherein data moved from the first NAND array to the second NAND array does not include the marked bad pages;
      in response to the second NAND array reaching a first particular cached data threshold capacity, demote remaining cached data within the second NAND array to the DRAM array and erase the remaining data of the first NAND array,
         wherein the first particular cached data threshold capacity is based on a total amount of cached data within the second NAND array meeting a maximum threshold amount; and
      in response to the DRAM array meeting a second particular cached data threshold capacity that is based on a total amount of cached data within the first and the second classes of the DRAM array, evict a preset number of least-frequently visited page partitions from the DRAM array.

2. The apparatus of claim 1, wherein the controller is further configured to cache data from the first NAND array to the second NAND array based on a characteristic of the data.

3. The apparatus of claim 1, further comprising a direct memory access (DMA) linking the controller to the DRAM array, a DMA linking the controller to the first NAND array, and a DMA linking the controller to the second NAND array.

4. The apparatus of claim 1, wherein the controller is further configured to track and report to a host device the actions of the read cache memory device via an interface.

5. A method for operating a memory, comprising:
promoting cached data from a first class of a dynamic random-access memory (DRAM) array to a second class of the DRAM array;
in response to the promoting, caching the data from the DRAM array to a first NAND array based on a preset number of most-frequently visited page partitions among the second DRAM class that have passed a preset threshold value of frequency and a characteristic of the data;
wherein the data characteristic includes at least one of a number of times the data is requested and a stability of the data:
simultaneous to the promoting and caching of the data from the DRAM, dynamically marking bad pages within the first NAND array; and
caching the data from the first NAND array to a second NAND array in response to the first NAND array meeting a first threshold cached data capacity,
wherein the data cached from the first NAND array to the second NAND array does not include the marked bad pages and wherein the first threshold cached data capacity is based on a total amount of cached data within the first NAND array meeting a maximum threshold amount;
in response to the second NAND array reaching a second threshold cached data capacity, demoting remaining cached data within the second NAND array to the DRAM array and erasing the remaining data of the first NAND array,
wherein the second threshold cached data capacity is based on a total amount of cached data within the second NAND array meeting a maximum threshold amount; and
in response to the DRAM array meeting a third cached data threshold capacity that is based on a total amount of cached data within the first and the second classes of the DRAM array, evict a preset number of least-frequently visited page partitions from the DRAM array.

6. The method of claim 5, further comprising erasing the first NAND array in response to caching the data from the first NAND array to the second NAND array.

7. A device, comprising:
a dynamic random-access memory (DRAM) array comprising a class;
a first NAND array formed on the first DRAM array;
a second NAND array formed on the first NAND array; and a controller configured to:
cache data meeting a first particular cached data threshold from the class of the DRAM array to the first NAND array,
wherein data moved from the DRAM array to the first NAND array comprises a preset number of most-frequently visited page partitions among the DRAM class that have passed a preset threshold value of frequency and wherein the controller is further configured to cache data from the DRAM array to the first NAND array based on a characteristic of the data;
wherein the data characteristic includes at least one of a number of times the data is requested and a stability of the data;
simultaneous to the caching of the data meeting the first particular cached data threshold, dynamically mark bad pages within the first NAND array;
simultaneous to the dynamically marking, cache data from the first NAND array to the second NAND array based on the capacity of the first NAND array,
wherein the data cached from the first NAND array to the second NAND array does not include the marked bad pages;
in response to the second NAND array reaching a second particular cached data threshold capacity, demote remaining cached data within the second NAND array to the DRAM array and erase the remaining data from the first NAND array,
wherein the second particular cached data threshold capacity is based on a total amount of cached data within the second NAND array meeting a maximum threshold amount; and
in response to caching the data meeting the first particular cached data threshold, evict data failing to meet the first particular cached data threshold from the class of the DRAM array; and
in response to the DRAM array meeting a third particular cached data threshold capacity that is based on a total amount of cached data within the DRAM array, evict a preset number of least-frequently visited page from the DRAM array.

8. The device of claim 7, wherein the controller includes an ASIC device.

9. The device of claim 7, wherein the first particular threshold includes data accessed a threshold number of times.

10. The device of claim 7, wherein the first particular threshold includes data meeting a stability threshold.

11. The device of claim 7, wherein the device is located between a host device and a solid state drive (SSD) or a third NAND device.

12. The device of claim 7, including the controller configured to store information associated with the data cached from the DRAM array to the first NAND array and the data cached from the first NAND array to the second NAND array.

* * * * *